United States Patent
Jeong et al.

(10) Patent No.: US 8,856,721 B2
(45) Date of Patent: Oct. 7, 2014

(54) METHOD FOR GENERATING TASK DATA OF A PCB AND INSPECTING A PCB

(71) Applicant: Koh Young Technology Inc., Seoul (KR)

(72) Inventors: Joong-Ki Jeong, Seoul (KR); Seung-Jun Lee, Seoul (KR)

(73) Assignee: Koh Young Technology Inc., Seoul (KR)

( * ) Notice: Subject to any disclaimer, the term of this patent is extended or adjusted under 35 U.S.C. 154(b) by 0 days.

(21) Appl. No.: 13/852,077

(22) Filed: Mar. 28, 2013

(65) Prior Publication Data

US 2013/0263078 A1    Oct. 3, 2013

(30) Foreign Application Priority Data

Mar. 28, 2012   (KR) .................. 10-2012-0031985

(51) Int. Cl.
  *G06F 17/50*    (2006.01)
  *G06F 11/22*    (2006.01)

(52) U.S. Cl.
  CPC .................. *G06F 17/5081* (2013.01)
  USPC .......................... 716/136; 716/137

(58) Field of Classification Search
  CPC ............ G06F 17/5036; G06F 17/5022; G06F 17/5081; G06F 17/5045; G06F 17/5068; G06F 17/5077; H05K 3/0005
  USPC ................................. 716/136, 137
  See application file for complete search history.

(56) References Cited

U.S. PATENT DOCUMENTS

| 7,514,943 | B2* | 4/2009 | Kimoto .................... 324/756.01 |
| 2001/0002935 | A1* | 6/2001 | Greenberg et al. ........... 382/147 |
| 2002/0015520 | A1* | 2/2002 | Roder ........................... 382/147 |
| 2002/0180468 | A1* | 12/2002 | Aspir et al. .................... 324/753 |
| 2006/0200332 | A1* | 9/2006 | Ishimoto et al. ................ 703/13 |
| 2009/0199149 | A1* | 8/2009 | Kwong ........................... 716/15 |
| 2010/0319972 | A1* | 12/2010 | Watanabe .................... 174/259 |
| 2012/0130666 | A1* | 5/2012 | Cho et al. ........................ 702/87 |
| 2013/0326453 | A1* | 12/2013 | Yu et al. ......................... 716/115 |

FOREIGN PATENT DOCUMENTS

| JP | 01-320415 | 12/1989 |
| JP | 03-191600 | 8/1991 |
| JP | 04-279808 | 10/1992 |
| JP | 06-069700 | 3/1994 |
| JP | 11-198343 | 7/1999 |
| JP | 2000-124598 | 4/2000 |
| JP | 2001-024321 | 1/2001 |
| JP | 2006-058284 | 3/2006 |

(Continued)

*Primary Examiner* — Stacy Whitmore
*Assistant Examiner* — Magid Dimyan
(74) *Attorney, Agent, or Firm* — Kile Park Reed & Houtteman PLLC

(57) ABSTRACT

A method for generating PCB inspection task data and inspecting a PCB is disclosed. The method by which Gerber data and CAD coordinate file generated at the time of PCB designing is matched to each other facilitates to generate a task data and allows a higher inspection accuracy. The task data generating method comprises generating a Gerber data comprising information for pads on the PCB, loading a CAD coordinate file comprising a coordinate of a component mounted on the pads, inferring a shape of lead and body of the component within a pad area by matching the Gerber data and CAD coordinate file, and then setting a pad area where a tip-end of the body locates as an inspection area.

16 Claims, 3 Drawing Sheets

(56) References Cited

FOREIGN PATENT DOCUMENTS

| | | |
|---|---|---|
| JP | 2006-220427 | 8/2006 |
| JP | 2008-153255 | 7/2008 |
| JP | 2008-175831 | 7/2008 |
| JP | 2009-008588 | 1/2009 |
| KR | 10-2009-0116114 | 11/2009 |

* cited by examiner

METHOD FOR GENERATING TASK DATA OF A PCB AND INSPECTING A PCB

CROSS REFERENCE TO RELATED APPLICATION

This application claims priority from and the benefit of Korean Patent Applications No. 2012-0031985 filed on Mar. 28, 2012, which is hereby incorporated by reference for all purposes as if fully set forth herein.

BACKGROUND OF THE INVENTION

1. Field of the Invention

The present invention relates to method for generating and task data of a PCB inspection apparatus and inspecting a PCB, more specifically to method for generating task data of a PCB inspection apparatus for optically inspecting assembly state of PCB components.

2. Discussion of the Background

Recently, PCB is getting lighter, thinner, shorter, and smaller for mounting highly integrated components and is getting more important as a fundamental element enhancing degree of integration.

In particular, sophisticated process for micronized patterns is required with degree of integration of PCB getting higher, so thorough inspection therefore has to be carried out.

An automated optical inspector (AOI) performs inspection task for guaranteeing quality of PCB based on a dedicated program.

The AOI is an equipment for inspecting whether leads of component are normally attached on PCB with 3-dimensional image data. In other words, the AOI requires information on which part of components will be checked and what will be checked up, and such information is generally set up through so-called programming.

Information on location and size, which the customer expects to be, of a component and information on real location and size, which is found out through 3-dimensional image data, of a component is required for above-mentioned programming, and it is determined whether the product is good or not comparing the two information.

However, inspection-related information has to be manually taught to the AOI according to the type of the PCB because location of soldering components and method of inspecting process are different for each type of the PCB. In other words, when a sole item is to be inspected, location of lead has to be registered manually one-by-one and it has to be manually checked what to do for the location. Therefore, inspection efficiency and productivity of PCB declines because such teaching becomes bothersome and time-consuming process.

SUMMARY OF THE INVENTION

A PCB inspection apparatus according to an exemplary embodiment of the present invention comprises generating a Gerber data comprising information for pads on the PCB; loading a CAD coordinate file comprising a coordinate of a component mounted on the pads; inferring a shape of the component within a pad area by matching the Gerber data and CAD coordinate file; setting a bridge inspection area between the pads based on the inferred shape of the component; and performing bridge inspection based on a set value.

A PCB inspection apparatus according to another exemplary embodiment of the present invention comprises generating a Gerber data comprising information for pads on the PCB; loading a CAD coordinate file comprising a coordinate of a component mounted on the pads; inferring a shape of the component within a pad area by matching the Gerber data and CAD coordinate file; setting a joint inspection area to be limited to the pad area based on the inferred shape of the component; and performing joint inspection based on a set value.

A PCB inspection apparatus according to another exemplary embodiment of the present invention comprises generating a Gerber data comprising information for pads on the PCB; loading a CAD coordinate file comprising a coordinate of a component mounted on the pads; inferring a shape of the component within a pad area by matching the Gerber data and CAD coordinate file; setting an offset based on the inferred shape of the component; and performing offset inspection based on a set value.

For example, the offset inspection may be performed by at least one of determining if a coordinate value of a center of the component corresponds to a coordinate of the pad and determining if a lead of the component is disposed at a predetermined area within the pad.

For example, the CAD coordinate may comprise a coordinate value of a center of a body of the component.

For example, the Gerber data may be generated from raw data of a solder paste Inspection (SPI) equipment.

For example, the inferring a shape of the component may comprise determining number of lead and component area based on a pad area; and setting a shape of a body of the component to at least one of length, width and thickness of the body based on the determined number of lead and component area.

As an alternative example, the inferring a shape of the component may comprise determining number of lead and component area by inferring the shape of the component based on a size of the pad area; searching the determined number of lead and body area from a component library; and setting information searched from the component library as the shape of the component of the pad area.

As another example, the inferring a shape of the component may comprise receiving an image information of a real component which is to be mounted on a pad area; overlapping the image information of the real component within the pad area; and setting a width of a lead of and a width of the inferred shape of the component to be identical to the image information of the real component.

Meanwhile, a PCB inspection apparatus according to another exemplary embodiment of the present invention comprises generating a Gerber data comprising information for pads on the PCB; loading a CAD coordinate file comprising a coordinate of a component mounted on the pads; inferring a shape of the component within a pad area by matching the Gerber data and CAD coordinate file; and setting a pad area where a tip-end of the lead as an inspection area.

For example, the inferring a shape of the component may comprise the inferring a shape of the component comprises receiving an image information of a real component corresponding to the pad area; overlapping the image information of the real component within the pad area; and setting a width of a lead of and a width of the inferred shape of the component to be identical to the image information of the real component.

For another example, determining number of lead and component area by inferring the shape of the component based on a size of the pad area; searching the determined number of lead and body area from a component library; and setting information searched from the component library as the shape of the component of the pad area.

For example, the inspection area is set as an inspection requirement for inspecting at least one of a bridge, joint and offset.

A PCB inspection apparatus according to still another exemplary embodiment of the present invention comprises generating a Gerber data comprising information for pads on the PCB; loading a CAD coordinate file comprising a coordinate of a component mounted on the pads; determining number of lead and component area by matching the Gerber data and CAD coordinate file to infer a shape of the component within a pad area; searching the determined number of lead and body area from a component library; and setting information searched from the component library as the shape of the component of the pad area.

In this embodiment, a PCB inspection apparatus may further comprise setting a pad area where an tip-end of the lead is located as an inspection area after the setting the shape of the component of the pad area.

For example, the inspection area is set as an inspection requirement for inspecting at least one of a bridge, joint and offset.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
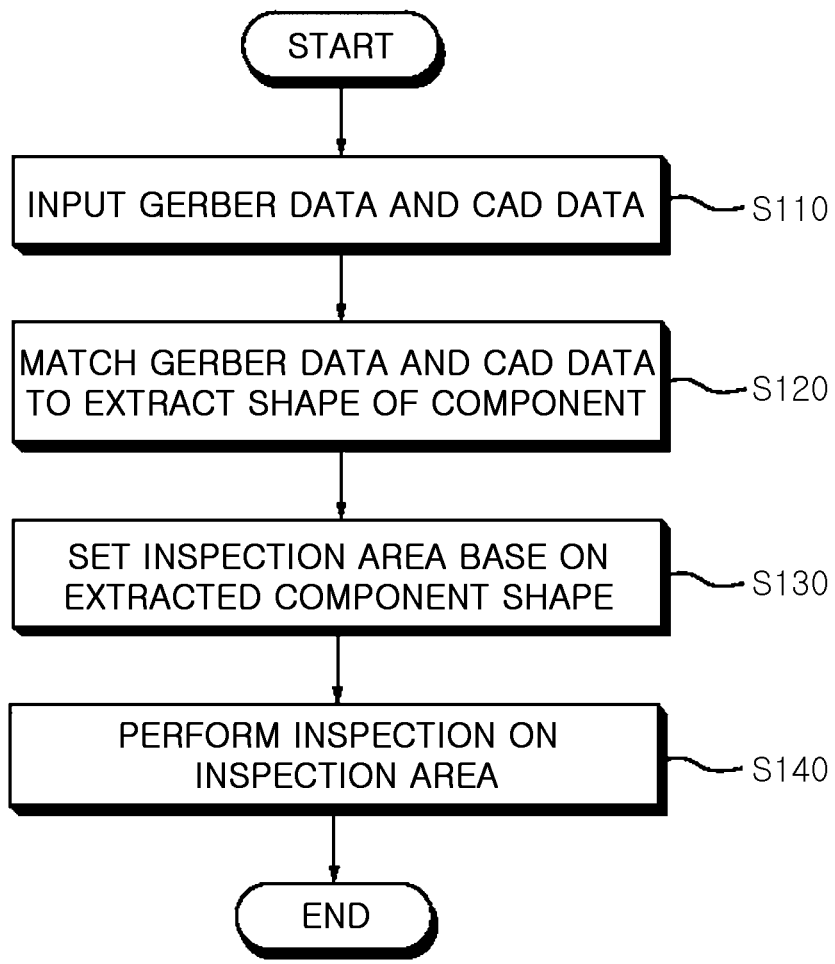
FIG. 1 is a flow chart illustrating a method for generating a task data and inspecting a PCB, according to an exemplary embodiment of the present invention.

The present invention is described more fully hereinafter with reference to the accompanying drawings, in which example embodiments of the present invention are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the invention are described herein with reference to cross-sectional illustrations that are schematic illustrations of idealized example embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes location. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments of the present invention will be described in detail with reference to the accompanying drawings.

FIG. 1 is a flow chart illustrating a method for generating a task data and inspecting a PCB, according to an exemplary embodiment of the present invention.

Referring to FIG. 1, in order to generate a task data through a task data generating method according to an embodiment of the present invention, first of all, step S110 inputting Gerber data and CAD data, including information about components mounted on a PCB, via input section (not shown) is performed. The Gerber data, which is a file generated when the PCB is designed, is a file used as a standard format regardless of CAD type. For example, a silk screen file including geometrical information, e.g., number, location, size, and shape of pads, is included in the Gerber data.

In other words, the Gerber data may include information value related to pads and is input through a user or a separate equipment. However, if the Gerber data does not exist separately, the Gerber data can be generated by obtaining pattern information value based on a mask pattern for silk screen printing, or by extracting only pattern information from a CAD design data file including PCB design information.

Otherwise, in case that an SPI equipment is used together, raw data which are used for 2D or 3D SPI equipment to detect soldering area based on a print information of a substrate may be input. In this case, raw data for PCB inspection equipment may be generated by process of the SPI raw data received from the SPI equipment.

Meanwhile, the CAD data includes, for example, center coordinate value of each component mounted on the PCB, and additionally may include name of each component.

Subsequently, grouping each of the pads is performed based on the pad information value input through the Gerber data.

Figure 2:
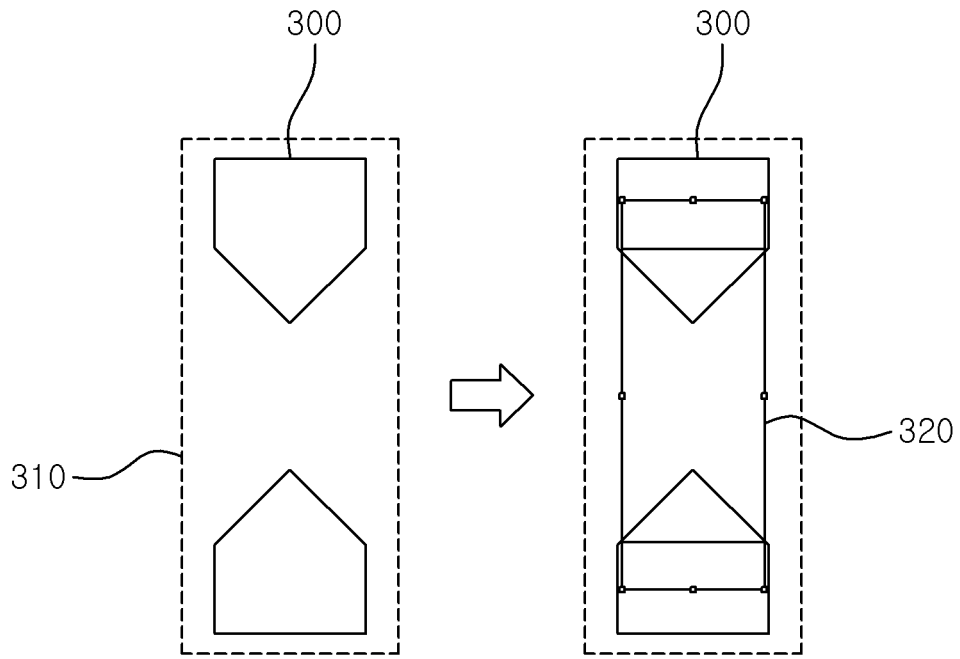
FIG. 2 illustrates an example of grouping pads of a substrate.

FIG. 2 illustrates an example of grouping pads of a substrate.

Referring to the FIG. 2, pads 20 of the substrate is grouped according to size or unit element package. For example, pads 20 may be divided to four groups, i.e., pad group A of which pads have sizes within range A, pad group B of which pads have sizes within range B, pad group C of which pads have sizes within range C, and pad group D of which pads have sizes within range D.

Subsequently, step S120 inferring a shape of a component, which is to be inspected, by matching each of the input Gerber data and CAD data through a control section (not shown) is performed.

Figure 3:
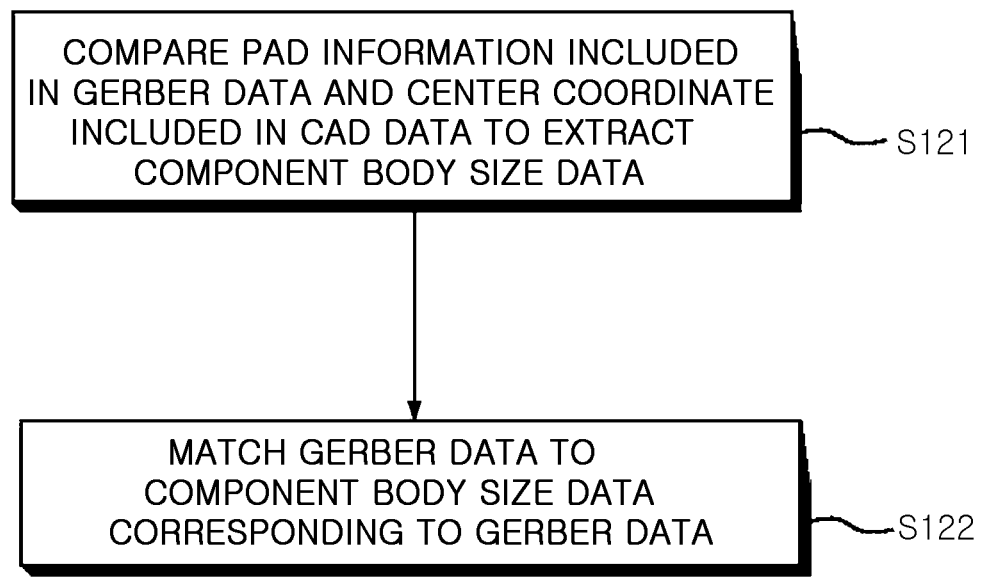
FIG. 3 is a flow chart illustrating a method of inferring a shape of a component.

FIG. 3 is a flow chart illustrating a method of inferring a shape of a component.

Referring the FIG. 3, in order to extract the shape of the component to be inspected, step S121 extracting size data of body of each component by comparing information about pads of each component, which is included in the input Gerber data, and center coordinates of each component which is included in the CAD data.

In other words, the Gerber data including information about pads, which has a center coordinate corresponding to a center coordinate of each component included in the CAD data, of each component is matched to the CAD data.

After matching the Gerber data and CAD data as mentioned above, each of which has a center coordinate corresponding to each other, size data of body of each component is extracted and distance from the center coordinate to pad is calculated based on the matched Gerber data and CAD data.

After extracting size data of body of each component thus, extracting a shape of each component (S122) by matching size data corresponding to the Gerber data to the Gerber data.

Wherein the information about the pads included in the Gerber data is information about numbers of the pads, location of the pad, a shape of the pad, and the like.

Figure 4:
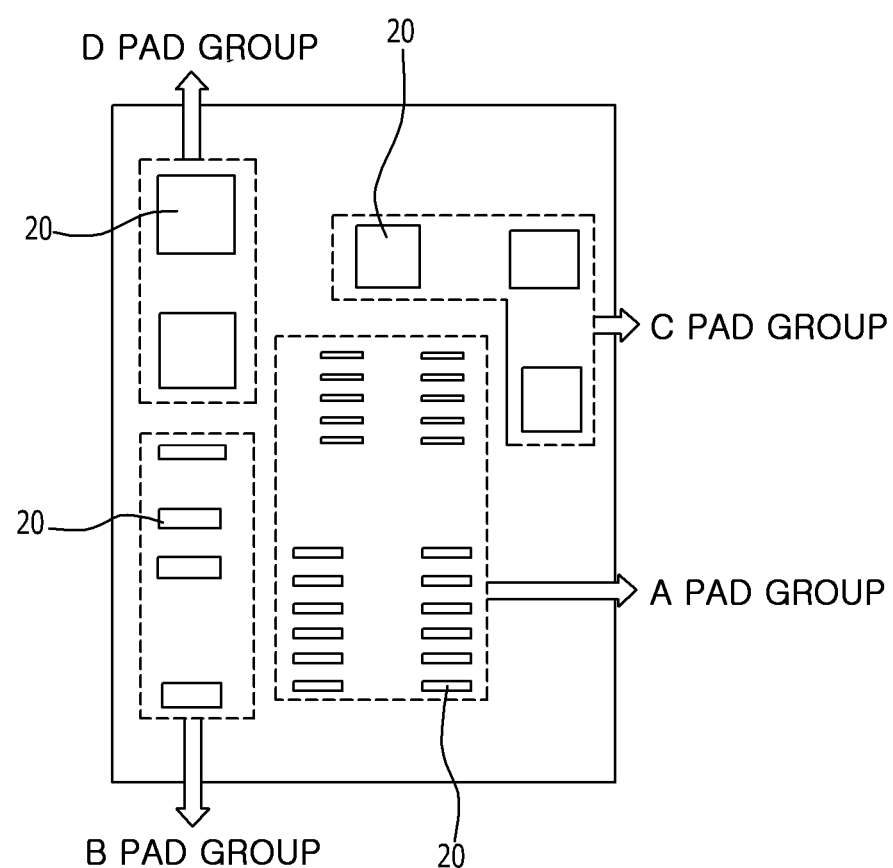
FIG. 4 is a plan view illustrating a semiconductor overlaid on pads which are grouped according to an exemplary embodiment of the present invention.

FIG. 4 is a plan view illustrating a semiconductor overlaid on pads which are grouped according to an exemplary embodiment of the present invention.

Referring the FIG. 4, it is possible to check information on pad area 300 through the Gerber data and to infer a shape (320) of the component mounted on the pad which is classified by grouping 310 per at least one pad.

In this case, inferring the shape of the component may be performed by use of a component library or by automatic generation of a geometrical shape of the component to be inspected.

In case of using a component library, it is possible to search a component name, if any included in the CAD data, from the library and to overlap the searched shape with the pad area.

And inferring a shape of the component based on the size of the grouped pad area to determine number of leads and body area by is performed. So, it is possible to check the corresponding component information and set the checked component information as the shape of the component.

Otherwise, in case that coordinate value and name of the component are included in CAD data, it is possible to check a corresponding component information by searching the component library based on the name of component.

The way of generating a geometrical shape of a component to be inspected may include confirming a pad area and a coordinate value of the component by matching the Gerber data and the CAD data and, based on that, inferring numbers of leads and shape of body of the component. In other words, after determining numbers of leads per each pad area, sequentially setting a length, width, and thickness by setting a body of the component to which each of the leads is connected can be performed.

As such, after inferring a geometrical shape of the component, setting inspection requirements based on that can be performed and, for more precise shape extraction, tuning the component shape can be performed.

When tuning the component shape, which is a process using a component image information including 3D or 2D image information of a real component, an image input beforehand or an image stored beforehand can be used.

Subsequently, after overlapping the component image information within the grouped pad area, width of the lead of the component and width of the body of the component will be tuned identical to those of the real component image information.

Also, it is possible to set a predetermined pad area where a tip-end of the set component, i.e., a predetermined tip-end is located, to a PCB inspection area.

As such, after inferring a shape of the component to be inspected, setting a bridge inspection area, setting a joint inspection area, and setting a offset inspection area can be performed.

A way of setting a bridge inspection area: setting a space not between leads but between pads as a bridge inspection area.

A way of setting a joint inspection area: setting a joint area of lead disposed within a pad, and limiting the joint inspection area as a pad area which is a real joint area.

Setting an offset: Setting a body center coordinate and a pad coordinate, setting an offset based on a set pad area and an inferred leads of the component, and performing offset-inspection by determining if the body center coordinate and a center value of the set pad area coincide each other, or by determining which area in the pad area the lead of the component exists in.

In other words, various type of inspection area mentioned above can be automatically set based on the Gerber data and the center coordinate value of CAD.

After shapes of each of the component is extracted through the step S120, step S130 setting an inspection area by a control section based on the shapes of each of the component is performed.

Then, after setting an inspection area, a step S140 inspecting the PCB is performed based on that.

In general, in case that only CAD coordinates, i.e., only coordinate information, does exist, a shape of a component cannot be extracted because it is impossible to know the numbers of component leads and the size of the component. Therefore, when one component is supposed to be inspected, teaching process becomes a bothersome and time-consuming because manually registering each leads of the component one-by-one and manually checking what to do for the area should be performed.

However, a method for generating teaching-data according to an embodiment of the present invention can extract shape data of each components by matching the Gerber data including pad information of each components and CAD data including center coordinate of each components. Therefore, it is possible to know location and shape of each components to be inspected.

A method for generating teaching-data according to an embodiment of the present invention can reduce time for teaching task.

Meanwhile, in PCB inspection process, inspecting how far a lead deviate from the pad based on the IPC (Institute for Interconnecting and Packaging Electronic Circuits) standard, but a general method has a problem of lower accuracy of inspection because there is no accurate data for the pad.

A method for generating and inspecting teaching-data according to an embodiment of the present invention can perform a bridge inspection by setting an inspection area between pads because it is possible to extract a shape data of each component and to know pad location and shape of each component.

Also, it is possible to facilitate programming for a task data file in the PCB inspection apparatus and to figure a real offset out by setting a pad area. At this moment, an offset is determined based on whether a center value of the component changes and which area within the pad area the lead exists on. Therefore, it can be inspected how many percentages of a lead deviates from the pad, and accuracy of PCB inspection can be enhanced because an accurate binding requirement can be provided.

Also, the above-mentioned general method has no way to substantially inspect deviation of a component because it has no accurate data for pad.

In other word, in case that there is no accurate data for pad, inspecting whether a product is good based on how far, e.g., in μm, an inspected component deviates from a center. In this case, there is no way to substantially inspect deviation of a component because a substantial offset is determined according to a relative deviation that is a proportion of an absolute deviation to a size of a pad.

On the other hand, A method for generating and inspecting teaching-data according to an embodiment of the present invention allows to substantially inspect deviation of a component because it is possible to extract a shape data of each component and to know pad location and shape of each component.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method for generating and inspecting a task data of PCB inspecting apparatus comprising using a computer system to perform the steps of:
   generating a Gerber data comprising information for pads formed on the PCB;
   loading a CAD coordinate file comprising a coordinate of a component mounted on the pads;
   inferring a shape of the component within a pad area by matching the Gerber data and CAD coordinate file;
   setting a space between at least two of the pads as a bridge inspection area based on the inferred shape of the component; and
   performing solder bridge inspection for the bridge inspection area based on a set value, wherein the solder bridge inspection comprises inspecting whether an unexpected solder connection exists between any two of the pads.

2. The method of claim 1, wherein the CAD coordinate comprises a coordinate value of a center of a body of the component.

3. The method of claim 1, wherein the Gerber data is generated from raw data of a solder paste inspection(SPI) equipment.

4. The method of claim 1, wherein the inferring a shape of the component comprises:
   determining number of lead and component area based on a pad area; and
   setting a shape of a body of the component to at least one of length, width and thickness of the body based on the determined number of lead and component area.

5. The method of claim 1, wherein the inferring a shape of the component comprises:
   determining number of lead and component area by inferring the shape of the component based on a size of the pad area;
   searching the determined number of lead and body area from a component library; and
   setting information searched from the component library as the shape of the component of the pad area.

6. The method of claim 1, wherein the inferring a shape of the component comprises:
   receiving an image information of a real component which is to be mounted on a pad area;
   overlapping the image information of the real component within the pad area; and
   setting a width of a lead of and a width of the inferred shape of the component to be identical to the image information of the real component.

7. A method for generating and inspecting a task data of PCB inspecting apparatus comprising using a computing system to perform the steps of:
   generating a Gerber data comprising information for pads formed on the PCB;
   loading a CAD coordinate file comprising a coordinate of a component mounted on the pads;
   inferring a shape of the component within a pad area by matching the Gerber data and CAD coordinate file;

setting an area in each pad area as a solder joint inspection area based on the inferred shape of the component; and performing solder joint inspection for each solder joint inspection area based on a set value, wherein solder joint inspection comprises inspecting a quality of application of solder paste.

8. A method for generating and inspecting a task data of PCB inspecting apparatus comprising using a computing system to perform the steps of:

generating a Gerber data comprising information for pads formed on the PCB;

loading a CAD coordinate file comprising a coordinate of a component mounted on the pads;

inferring a shape of the component within a pad area by matching the Gerber data and CAD coordinate file;

setting an offset based on the inferred shape of the component; and performing offset inspection based on a set value, wherein the offset comprises an allowable amount of deviation between an actual position of applied solder paste and a desired position of solder paste.

9. The method of claim 8, wherein the offset inspection is performed by determining if a coordinate value of a center of the component corresponds to a coordinate of the pad or determining if a lead of the component is disposed at a predetermined area within the pad.

10. A method for generating and inspecting a task data of PCB inspecting apparatus comprising using a computing system to perform the steps of:

generating a Gerber data comprising information for pads formed on the PCB;

loading a CAD coordinate file comprising a coordinate of a component mounted on the pads;

inferring a shape of the component within a pad area by matching the Gerber data and CAD coordinate file; and setting a pad area comprising an end of a lead of the component as an inspection area.

11. The method of claim 10, wherein the inferring a shape of the component comprises:

receiving an image information of a real component corresponding to the pad area;

overlapping the image information of the real component within the pad area; and setting a width of a lead of and a width of the inferred shape of the component to be identical to the image information of the real component.

12. The method of claim 10, wherein the inferring a shape of the component comprises:

determining number of lead and component area by inferring the shape of the component based on a size of the pad area;

searching the determined number of lead and body area from a component library; and setting information searched from the component library as the shape of the component of the pad area.

13. The method of claim 10, wherein the inspection area is set as an inspection requirement for inspecting at least one of a bridge, joint and offset.

14. A method for generating and inspecting a task data of PCB inspecting apparatus comprising using a computing system to perform the steps of:

generating a Gerber data comprising information for pads formed on the PCB;

loading a CAD coordinate file comprising a coordinate of a component mounted on the pads;

determining a number of leads and a component area by matching the Gerber data and CAD coordinate file to infer a shape of the component within a pad area;

searching a component library for component shapes having the determined number of leads and the component area; and setting results from the component library search as a shape of the component of the pad area.

15. The method of claim 14, further comprising setting a pad area where an tip-end of the lead is located as an inspection area after the setting the shape of the component of the pad area.

16. The method of claim 15, wherein the inspection area is set as an inspection requirement for inspecting at least one of a bridge, joint and offset.

* * * * *